United States Patent
Tang et al.

[11] Patent Number: 5,861,661
[45] Date of Patent: Jan. 19, 1999

[54] COMPOSITE BUMP TAPE AUTOMATED BONDED STRUCTURE

[75] Inventors: Pao-Yun Tang; Shyh-Ming Chang, both of Hsinchu; Yu-Chi Lee, Taipei; Su-Yu Fang, Hsinchu, all of Taiwan

[73] Assignee: Industrial Technology Research Institute, Hsin-Chu, Taiwan

[21] Appl. No.: 974,454

[22] Filed: Nov. 20, 1997

Related U.S. Application Data

[63] Continuation of Ser. No. 578,929, Dec. 27, 1995, Pat. No. 5,749,997.

[51] Int. Cl.$^6$ .................................................. H01L 23/495
[52] U.S. Cl. .......................... 257/668; 257/738; 257/783
[58] Field of Search ................................ 257/668, 676, 257/738, 778, 781, 783, 690

[56] References Cited

U.S. PATENT DOCUMENTS

| | | | |
|---|---|---|---|
| 4,731,282 | 3/1988 | Tsukagashi et al. | 428/220 |
| 4,740,657 | 4/1988 | Tsukagashi et al. | 174/88 |
| 4,811,081 | 3/1989 | Lyden | 357/80 |
| 4,963,002 | 10/1990 | Tagusa et al. | 350/336 |
| 5,001,542 | 3/1991 | Tsukagoshi et al. | 357/68 |
| 5,136,365 | 8/1992 | Pennisi et al. | 357/72 |
| 5,604,379 | 2/1997 | Mori | 257/738 |
| 5,641,996 | 6/1997 | Omoya et al. | 257/783 |
| 5,705,852 | 1/1998 | Orihara et al. | 257/679 |
| 5,726,491 | 3/1998 | Tajima et al. | 257/668 |

FOREIGN PATENT DOCUMENTS 362927   3/1991   Japan .

*Primary Examiner*—Olik Chaudhuri
*Assistant Examiner*—Nathan K. Kelley
*Attorney, Agent, or Firm*—George O. Saile; Stephen B. Ackerman; Larry J. Prescott

[57] ABSTRACT

This invention provides a bonded structure and a method of forming the bonded structure for joining a lead array to the conducting bonding pads of an integrated circuit element. The invention uses an anisotropic conductive film with tape automated bonding to form the bonded structure. The invention also uses integrated circuit elements having composite bumps as input/output pads. The composite bumps comprise a polymer body covered by a conductive metal coating. The invention provides a low cost method of tape automated bonding which uses lower temperature and pressure in the bonding process and provides a bond which is automatically encapsulated after the bonding has been completed. The lower temperature and pressure improve the dimensional stability of the elements of the bonded structure and the automatic encapsulation provides improved reliability.

10 Claims, 8 Drawing Sheets

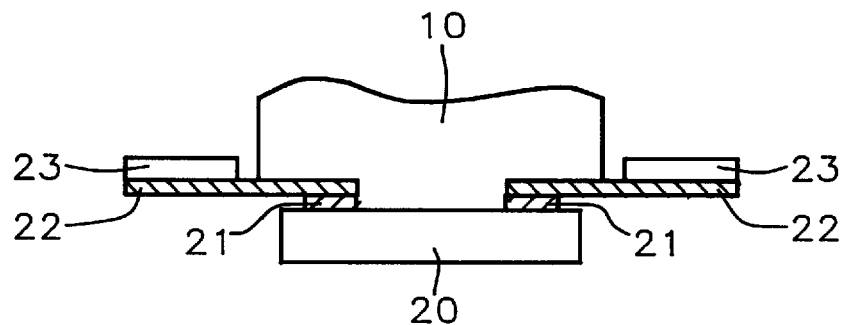
FIG. 1 - Prior Art
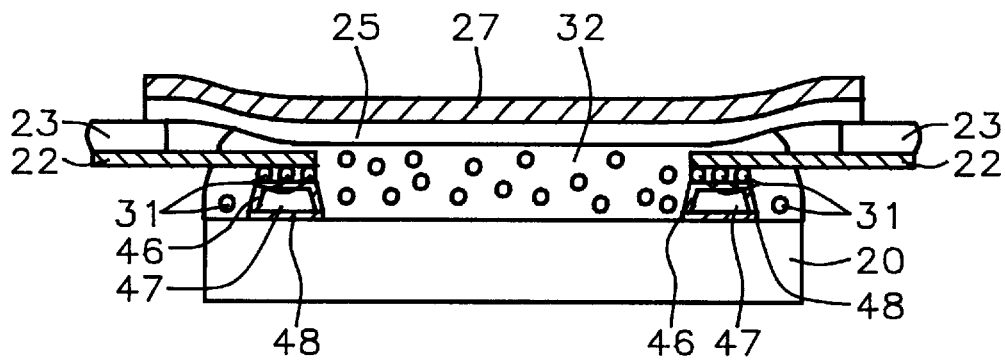
FIG. 2A
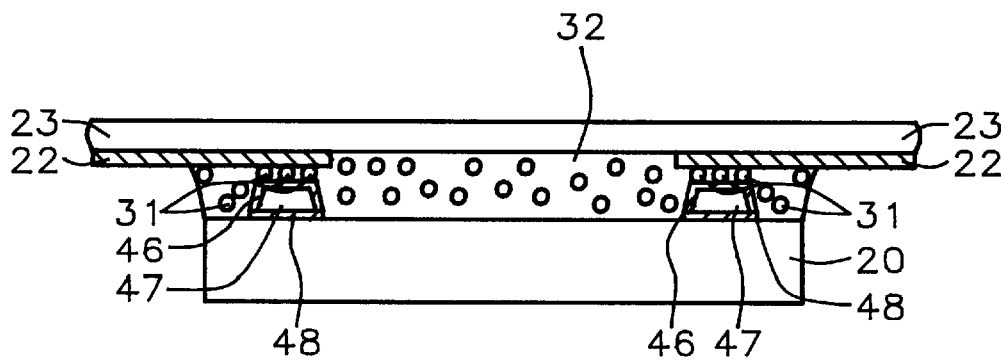
FIG. 2B

COMPOSITE BUMP TAPE AUTOMATED BONDED STRUCTURE

This is a division of patent application Ser. No. 08/578,929, filing date Dec. 27, 1995, now U.S. Pat. No. 5,749,997, A New Composite Bump Tape Automated Bonding Method And Bonded Structure, assigned to the same assignee as the present invention.

RELATED PATENT APPLICATIONS (1) (E83-0002), Ser. No. 08/239,375, filed May 6, 1994, entitled "Composite Bump Bonding" assigned to the same assignee.

(2) (E83-0004), Ser. No. 08/239,380, filed May 6, 1994, entitled "Composite Bump Flip Chip Bonding" assigned to the same assignee.

(3) (E83-0003A), U.S. Pat. No. 5,393,697, to Chang et al, Feb. 28, 1995, entitled "Composite Bump Structure and Methods of Fabrication," filed May 6, 1994.

(4) (E83-0003B), Ser. No. 08/387,095, filed Feb. 13, 1995 entitled "Composite Bump Structure and Methods of Fabrication," assigned to the same assignee.

(5) (E84-0010), Ser. No. 08/494,582, filed Jun. 23, 1995 entitled "Connection Construction and Method of Manufacturing the Same," assigned to the same assignee.

(6) (ERSO-84-0052), Serial No. , filed entitled "A New Tape Automated Bonding Method And Bonded Structure" assigned to the same assignee.

BACKGROUND OF THE INVENTION (1) Field of the Invention

The invention relates to the use of an anisotropic conductive film, having conductive particles in an insulating adhesive, with tape automated bonding to form interconnections between a lead array and an integrated circuit element with composite bump input/output pads. The use of an anisotropic conductive film provides a bonding process with reduced temperature and pressure and a reliable encapsulated bonded structure. The use of the composite bump input/output pads on the integrated circuit element allows the interconnection to be made with reduced bonding force.

(2) Description of Related Art

In conventional tape automated bonding high temperatures are required to form the bond between the inner lead ends of a lead array and the bonding pads on an integrated circuit element. The difference in thermal expansion between the elements of the assembly can distort the lead array and make subsequent processing, such as bonding the outer lead ends, difficult. This invention provides a method to avoid this problem by using an anisotropic conductive film in combination with tape automated bonding and composite bump input/output pads on an integrated circuit element. The anisotropic conductive film comprises conductive particles in an insulating adhesive.

U.S. Pat. No. 4,963,002 to Tagusa et al describes a connection construction using conductive particles and both conductive and insulating adhesives. Japanese Patent 3-62927 to Fujimoto describes a composite conductive particle, an adhesive layer, and flip chip bonding.

U.S. Pat. No. 5,001,542 to Tsukagoshi et al. describes a board made of glass, synthetic resin, metal ceramic or their composite materials. Tsukagoshi et al. use a combination of conducting particles, insulating particles, and an adhesive to form the electrical bond. The conducting particles are metal such as nickel, silver or gold. The Invention of this Patent Application uses an anisotropic conducting film having composite bumps in an insulating adhesive. The composite bumps have a polymer body covered by a conductive metal coating.

U.S. Pat. No. 4,470,657 to Tsukagoshi et al. describes the use of an anisotropic conductive film using an adhesive with conductive particles of multiple sizes.

U.S. Pat. No. 4,731,282 to Tsukagoshi et al. describes insulating adhesives.

SUMMARY OF THE INVENTION

A diagram of a conventional TAB, or tape automated bonding setup is shown in FIG. 1. A lead array having leads 22 of a metal such as copper are formed on a dielectric layer 23 such as polyimide. The inner end of the leads contact conductive bonding pads 21, of a material such as gold, formed on an integrated circuit element 20. Heat energy at a chosen temperature and pressure, for a chosen time is delivered by a thermode 10 which is brought into contact with the leads of the lead array and a bond is formed between the inner ends of the leads 22 and the conductive bonding pads 21.

In conventional tape automated bonding high temperatures, often between 450° C. and 550° C., are required to form the bond between the inner lead end of the lead array and the bonding pad on the integrated circuit element. The difference in thermal expansion between the copper lead 22 and the dielectric layer 23 which will distort the lead array and make subsequent processing, such as bonding the outer lead ends, difficult. Frequently the hardness of the gold bump can transmit damaging forces from the thermode to the integrated circuit element. The planarity of the thermode with respect to the bonding pads becomes very important and increases the cost of the equipment used in the bonding process. In conventional tape automated bonding it is important to encapsulate the bond as soon as it has been formed to prevent damage due for example to moisture and corrosion.

It is an object of this invention to provide a low cost method of tape automated bonding which uses lower temperature and pressure in the bonding process and provides a bond which is automatically encapsulated after the bonding has been completed.

It is a further object of this invention to provide a bonded structure formed using a low cost method of tape automated bonding which uses lower temperature and pressure in the bonding process and which is automatically encapsulated after the bonding has been completed.

These objectives are achieved using composite bumps on an integrated circuit element and an anisotropic conductive film in the bonding process. The anisotropic film comprises conductive particles in an insulating adhesive. The composite bumps comprise a polymer body covered by a conductive metal coating. Using the anisotropic conductive film conductive particles 31 are placed between the leads 22 of the lead array and the conductive metal coating 46 of the composite bumps formed on the integrated circuit element 20, see FIGS. 2A and 2B. The composite bumps have a polymer body 47, a conductive metal coating 46, and are formed on a contact pad 48 on the integrated circuit element 20. The conductive particles and the composite bumps compensate for deviations in planarity between the thermode and the conductive bonding pads so the bonding pressure can be substantially reduced, between about 20 and 40 kilograms/cm². When the bond is formed the insulating adhesive 32 forms an encapsulation of the bond which protects the bond from moisture, corrosion, and mechanical damage. The bonding temperatures required are between about 150° C. and 180° C. and the insulating adhesive forms an adhesive bond to keep the electrical bond in place.

The lead array can be of the window type such as that shown in FIG. 2C. A lead array having leads 22 formed of a material such as copper are formed on a dielectric layer 23 formed of a material such as polyimide. The dielectric layer has an inner perimeter 73 bounding a region 75 with no dielectric material. The inner lead ends 74 of the leads extend into the region of no dielectric material. In this type of lead array an isolation film comprising a metal foil layer 27 formed on a polyimide layer 25 is used in the bonding process, see FIG. 2A.

The lead array can also be of the type shown in FIG. 2D where there is no window and the leads 22 of the lead array are formed entirely on the polyimide layer 23. In this type of lead frame the isolation film is not required, as shown in FIG. 2B.

The insulating adhesive in the anisotropic conductive film can be a thermoplastic material, a thermosetting material, or a type of material which is both thermoplastic and thermosetting. The conductive particles can be metal spheres, graphite particles, or composite particles having a polymer body covered by a conductive metal coating.

BRIEF DESCRIPTION OF THE DRAWINGS

FIG. 1 shows a diagram of a conventional tape automated bonding set up.

FIG. 2A shows a cross section of a bonded structure formed using composite bumps, an anisotropic conductive film, a lead array without a window, and tape automated bonding.

FIG. 2B shows a cross section of a bonded structure formed using composite bumps, an anisotropic conductive film, a lead array with a window, and tape automated bonding.

DESCRIPTION OF THE PREFERRED EMBODIMENTS

Figure 2C:
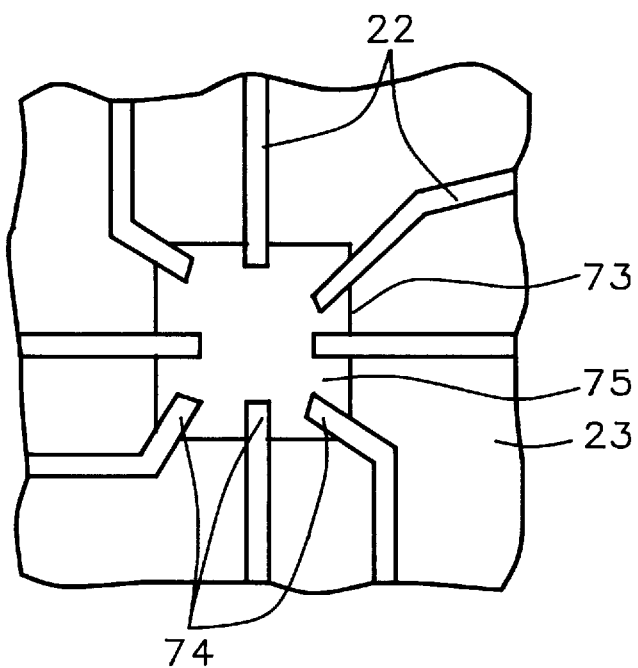
FIG. 2C shows a top view of a lead array with a window.
Figure 3A:
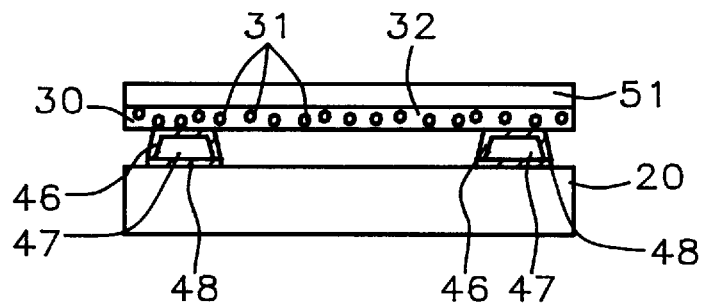
FIG. 3A shows a cross section of an anisotropic conductive film placed on an integrated circuit element covering the composite bumps.

Refer now to FIGS. 2A, 2C, 3A–3E, 5A–5E, 6A, and 6B, there is shown an embodiment of a method of forming a bonded structure using an integrated circuit element with composite bumps, an anisotropic conductive film, a lead array with a window, and tape automated bonding. FIG. 3A shows a cross section view of an integrated circuit element 20 having composite bumps 46, 47, and 48 formed thereon. The composite bumps are comprised of a polymer body 47, such as polyamic acid polyimide, covered by a conductive metal coating 46, such as a composite of chrome/gold or nickel/gold. In this example the composite bump is formed on a base metal pad 48, such as aluminum, however the base metal pad may be eliminated if desired. The structure and methods of fabrication of composite bumps are described in U.S. Pat. No. 5,393,697 to Chang et al. dated Feb. 28, 1995 which is hereby incorporated by reference. An anisotropic conductive film 30 is cut to the proper size and placed over the integrated circuit element 20 so that the anisotropic film contacts the conductive coating 46 of the composite bumps. The anisotropic conductive film 30 comprises conductive particles 31 in an insulating adhesive 32 formed on a protective layer 51, in this example polyester.

Figure 5A:
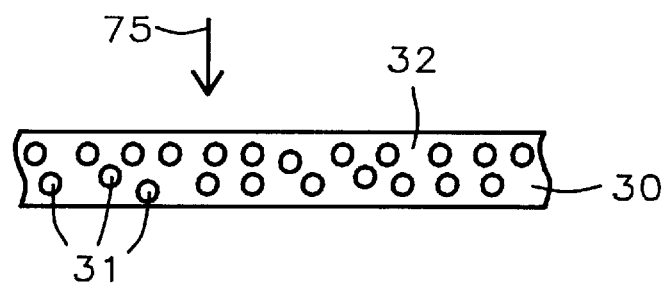
FIG. 5A shows a cross section view of the anisotropic conductive film.
Figure 5B:
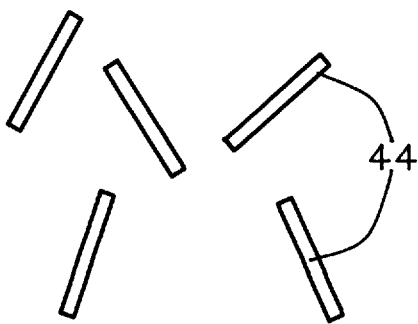
FIG. 5B shows graphite conductive particles for the anisotropic conductive film.
Figure 5C:
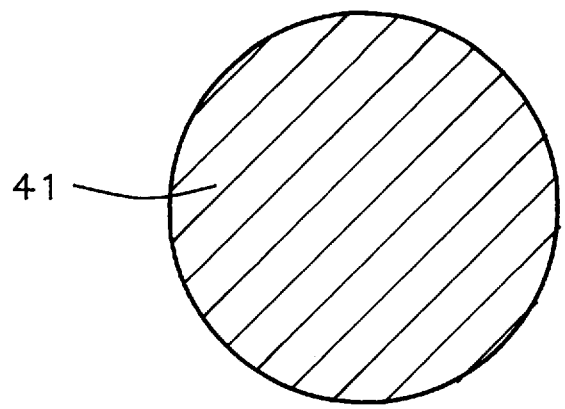
FIG. 5C shows metal spheres as conductive particles for the anisotropic conductive film.
Figure 5D:
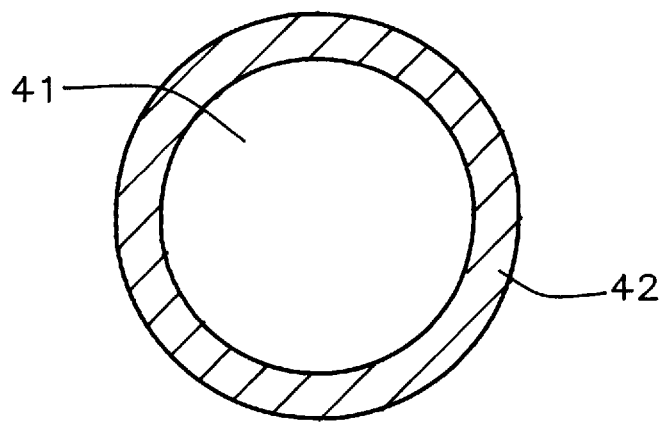
FIG. 5D shows composite particles with a polymer body covered by a conductive metal coating as conductive particles for the anisotropic conductive film.
Figure 5E:
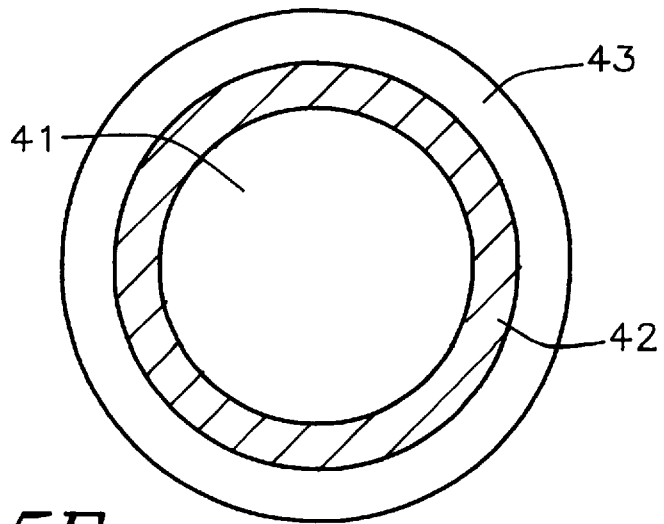
FIG. 5E shows composite particles with a first polymer body, covered by a conductive metal coating, and covered by a second polymer layer as conductive particles for the anisotropic conductive film.
Figure 6A:
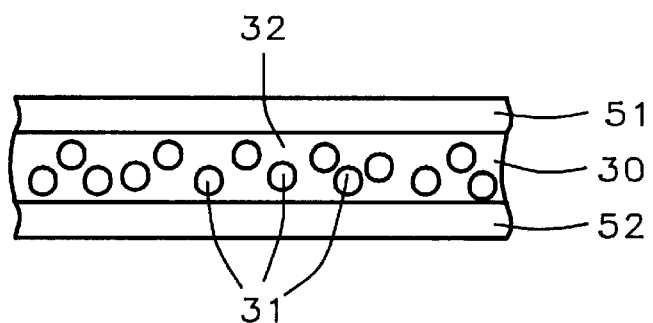
FIG. 6A shows a cross section view of an anisotropic conductive film with a dielectric layer on both sides of the film.
Figure 6B:
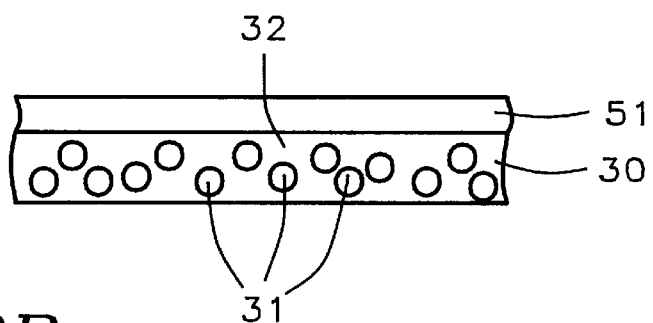
FIG. 6B shows a cross section view of an anisotropic conductive film with a dielectric layer on one side of the film.

The anisotropic conductive film 30, comprising conductive particles 31 and an insulating adhesive 32, can also be formed without the dielectric layer as is shown in FIG. 5A. Some examples of the conductive particles are shown in FIGS. 5B–5E. The conductive particles can be graphite 44 as shown in FIG. 5B, metal spheres 41 as shown in FIG. 5C, a composite particle having a polymer body 41 covered by a conductive metal coating 42 as shown in FIG. 5D, or a composite particle having a polymer body 41 covered by a conductive metal coating covered by a polymer coating 43 as shown in FIG. 5E. Some examples of the anisotropic conductive film are shown in FIGS. 6A and 6B. As shown in FIG. 6A the anisotropic conductive film 30 comprising conductive particles 31 in an insulating adhesive 32 can have a protective layer 51 and 52 on both sides of the anisotropic conductive film. As shown in FIG. 6B the anisotropic conductive film 30 comprising conductive particles 31 in an insulating adhesive 32 can have a protective layer 51 on only one side of the anisotropic conductive film. Referring now to FIG. 5A, when the anisotropic conductive film is compressed in the direction of the arrow 75 the film will conduct in the direction of the arrow but remains an insulator in directions orthogonal to the arrow 75.

Figure 3B:
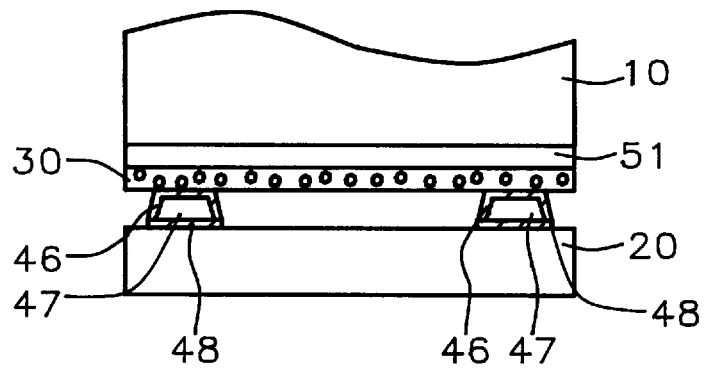
FIG. 3B shows a cross section view of a thermode in contact with an anisotropic film placed on an integrated circuit element with composite bumps.
Figure 3C:
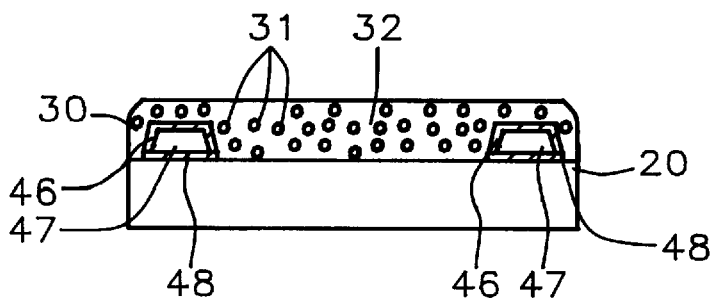
FIG. 3C shows a cross section of an anisotropic conductive film on an integrated circuit element with composite bumps which has been pre heated.

Refer now to FIG. 3B, there is shown a cross section view of a thermode 10 brought into contact with the protective layer 51 on one side of the anisotropic conductive film 30. The thermode 10 can deliver heat energy at a chosen temperature and pressure to objects in contact with the thermode. The thermode preheats the anisotropic conductive film to a temperature of between about 95° C. and 120° C. at a pressure of between about 5 and 10 kilograms/cm$^2$ for between about 3 and 5 seconds. This preheat cycle causes the insulating adhesive to flow slightly completely covering the composite bumps 46, 47, and 48, as shown in FIG. 3C. As shown in FIG. 3C, the protective layer 51 is then removed from the anisotropic conductive film.

Figure 3D:
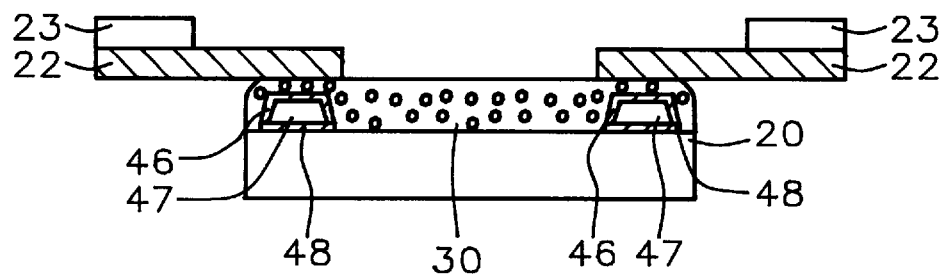
FIG. 3D shows a cross section view of a lead array with a window placed on an anisotropic conductive film placed on an integrated circuit element with composite bumps and preheated.

Next, as shown in FIG. 3D, a lead array comprising metal conducting leads 22 formed on a first dielectric layer 23 is placed on the anisotropic conductive film 30 so that the inner ends of the metal conducting leads 22 are over the conductive metal coating 46 of the composite bumps 46, 47, and 48 on the integrated circuit element 20. In this example the metal conducting leads 22 are copper and the first dielectric layer 23 is polyimide. A top view of the lead array is shown in FIG. 2C. As shown in FIG. 2C, the first dielectric layer 23 has an inner perimeter 73 bounding a center region 75 having no dielectric material. In this lead array the inner ends of the leads 22 extend into the region having no dielectric material. This extension of the inner lead ends into the region of no dielectric material can also be seen in FIG. 3D.

Figure 3E:
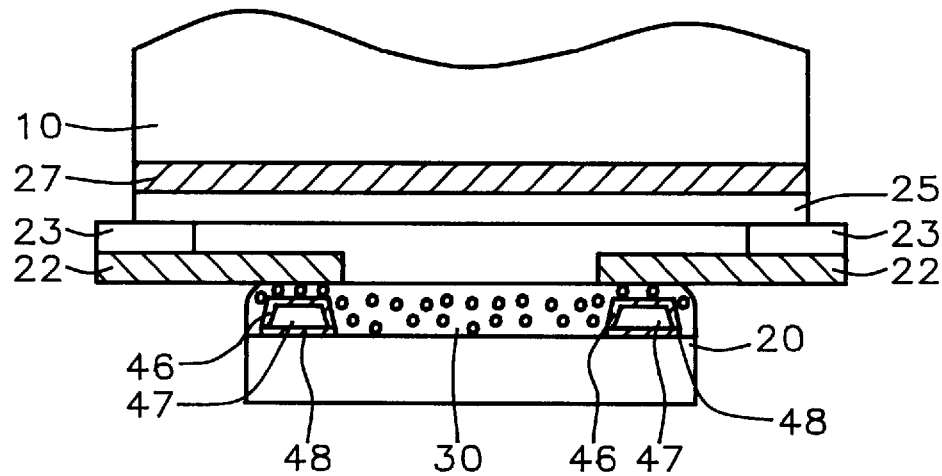
FIG. 3E shows the structure of FIG. 3D with an isolation film placed on the lead array and a thermode applied to the isolation film.

Next, as shown in FIG. 3E, an isolation layer comprising a metal foil layer 27 formed on a second dielectric layer 25. In this example the second dielectric layer 25 is polyimide with a thickness of between about 70 and 75 microns, and the metal foil layer 27 is aluminum with a thickness of between about 30 and 35 microns. The isolation layer is placed so that the isolation layer covers the window or region of the lead array with no first dielectric material, the second dielectric material 25 of the isolation layer contacts the first dielectric material 23 around the entire inner perimeter of the lead array bounding the window, and the second dielectric layer 25 of the isolation layer separates the metal foil 27 of the isolation layer from the lead array.

Next, as shown in FIG. 3E, the thermode 10 is brought into contact with the metal foil 27 of the isolation layer. The thermode delivers heat energy with a thermode temperature setting of between about 280° C. and 300° C. and a pressure of between about 20 and 40 kilograms/cm$^2$ for between about 5 and 20 seconds to isolation layer, lead array, composite bumps, and integrated circuit element assembly shown in FIG. 3E thereby forming the completed bonded structure shown in FIG. 2A. When the assembly is compressed during the bonding process a number of conductive particles 31 in the anisotropic conductive film will be between the inner lead end and composite bump of each bonding pair and the conductive particles 31 will make electrical contact with the lead end and conductive metal coating 46 of the composite bump of each bonding pair. The conductive metal coating 46 and the polymer body 47 of the composite bumps are deformed when the bond is formed.

An embodiment of the completed bonded structure formed by the method of the preceding embodiment is shown in FIG. 2A. The composite bumps 46, 47, and 48 are formed on the integrated circuit element 20. The composite bumps are described in the previous embodiment. The inner lead ends of the copper leads 22 of the lead array are positioned so that one inner lead end overlays the conductive metal coating 46 of each composite bump 46, 47, and 48 forming a bonding pair. When the assembly is compressed during the bonding process described above a number of conductive particles 31 in the anisotropic conductive film are between the inner lead end and the conductive metal coating 46 of the composite bump of each bonding pair and the conductive particles 31 make electrical contact with the lead end and the conductive metal coating 46 of the composite bump of each bonding pair. The conductive metal coating 46 and polymer body 47 of the composite bumps are deformed when the bond is formed. The second dielectric layer 25 of the isolation layer contacts the insulating adhesive 32 of the anisotropic conductive film and the first dielectric layer 23 of the lead array at the inner perimeter of the window. The insulating adhesive reflows during the time heat and pressure is delivered to the assembly by the thermode and encapsulates the bonded structure and holds the entire assembly together after curing. The insulating adhesive can be a material such as an ethylene-vinyl acetate copolymer, polyethylene, ethylene-propylene copolymer, acrylic rubber, or the like. These polymers can be used alone or as a mixture. The insulating adhesive can be thermoplastic, thermosetting, or a mixture of thermoplastic and thermosetting. The isolation layer described in this example is an aluminum foil 27, with a thickness of between about 70 and 75 microns, formed on a layer of polymer 25, with a thickness of between about 30 and 35 microns but can also be a layer of silicone rubber formed on a layer of polymer or other such materials.

Figure 2D:
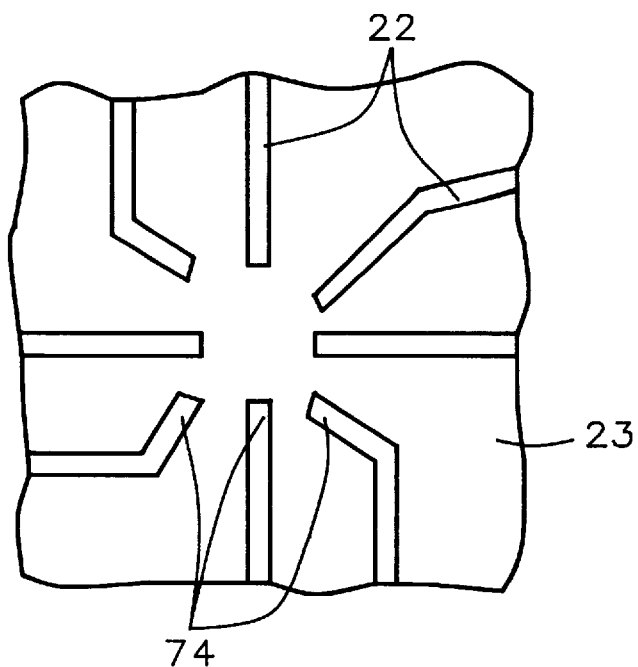
FIG. 2D shows a top view of a lead array without a window.
Figure 4A:
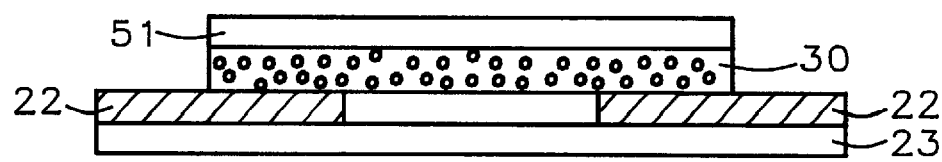
FIG. 4A shows a cross section view of an anisotropic conductive film with protective backing placed on a lead array without a window.

Refer now to FIGS. 2B, 2D, 4A–4E, 5A–5E, 6A, and 6B, there is shown another embodiment of a method of forming a bonded structure using an anisotropic conductive film, a lead array without a window, an integrated circuit element with composite bumps, and tape automated bonding. FIG. 4A shows a cross section view of an anisotropic conductive film 30 with a protective backing 51 on one side of the conductive film placed on a lead array comprising a first dielectric layer 23 and metal leads 22. FIG. 2D shows a top view of the lead array for this embodiment. The metal leads 22 are formed on the first dielectric layer 23 which in this embodiment has no window without dielectric material. The inner ends 74 of the leads are formed on the first dielectric layer 23.

The anisotropic conductive film 30, comprising conductive particles 31 and an insulating adhesive 32, without the dielectric layer is shown in FIG. 5A. Some examples of the conductive particles are shown in FIGS. 5B–5E. The conductive particles can be graphite 44 as shown in FIG. 5B, metal spheres 41 as shown in FIG. 5C, a composite particle having a polymer body 41 covered by a conductive metal coating 42 as shown in FIG. 5D, or a composite particle having a polymer body 41 covered by a conductive metal coating covered by a polymer coating 43 as shown in FIG. 5E. Some examples of the anisotropic conductive film are shown in FIGS. 6A and 6B. As shown in FIG. 6A the anisotropic conductive film 30 comprising conductive particles 31 in an insulating adhesive 32 can have a protective layer 51 and 52 on both sides of the anisotropic conductive film. As shown in FIG. 6B the anisotropic conductive film 30 comprising conductive particles 31 in an insulating adhesive 32 can have a protective layer 51 on only one side of the anisotropic conductive film. Referring now to FIG. 5A, when the anisotropic conductive film is compressed in the direction of the arrow 75 the film will conduct in the direction of the arrow but remains an insulator in directions orthogonal to the arrow 75.

Refer again to FIG. 4A, the anisotropic conductive film 30 is cut to the proper size and placed on the lead array. The anisotropic conductive film has a protective layer 51 on one side of the anisotropic conductive film and is placed on the lead array so that the insulating adhesive contacts and covers the inner lead ends of the lead array. The lead array comprises metal leads 22 formed on a first dielectric layer 23. In this example the leads 22 of the lead array are copper, the first dielectric material in the first dielectric layer 23 is polyimide, the protective layer 51 on one side of the anisotropic conductive film is polyimide, and the insulating adhesive is a thermoplastic material, a thermosetting material, or a combination of thermoplastic and thermosetting materials.

Figure 4B:
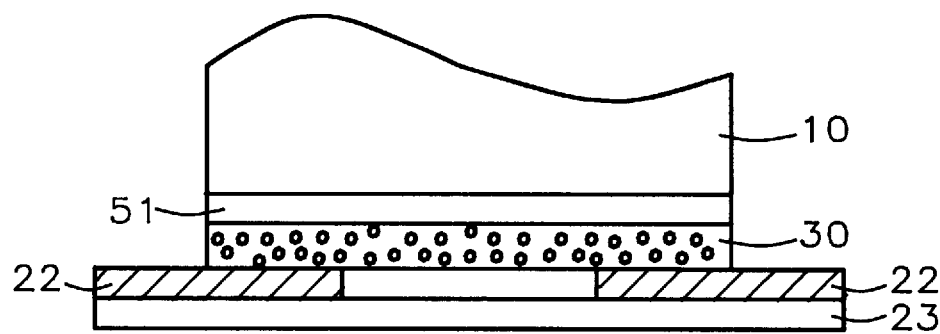
FIG. 4B shows a thermode in contact with an anisotropic conductive film with a protective backing placed on a lead array without a window.
Figure 4C:
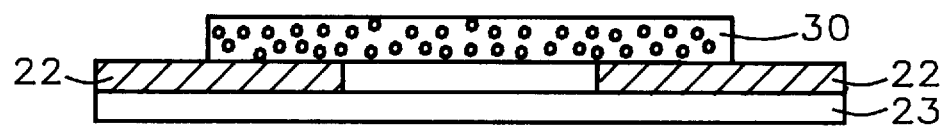
FIG. 4C shows a cross section view of an anisotropic conductive film on a lead array after pre heating and removal of the protective backing.

Next, as shown in FIG. 4B, the thermode 10 is brought into contact with the protective layer on the anisotropic conductive film and the assembly is pre-heated to a temperature of between about 95° C. and 120° C. at a pressure of between about 5 and 10 kilograms/cm$^2$ for between about 3 and 5 seconds. As shown in FIG. 4C, the pre heating attaches the insulating adhesive to the inner lead ends of the lead array but does not cause the insulating adhesive to flow. As shown in FIG. 4C, the protective layer is then removed.

Figure 4D:
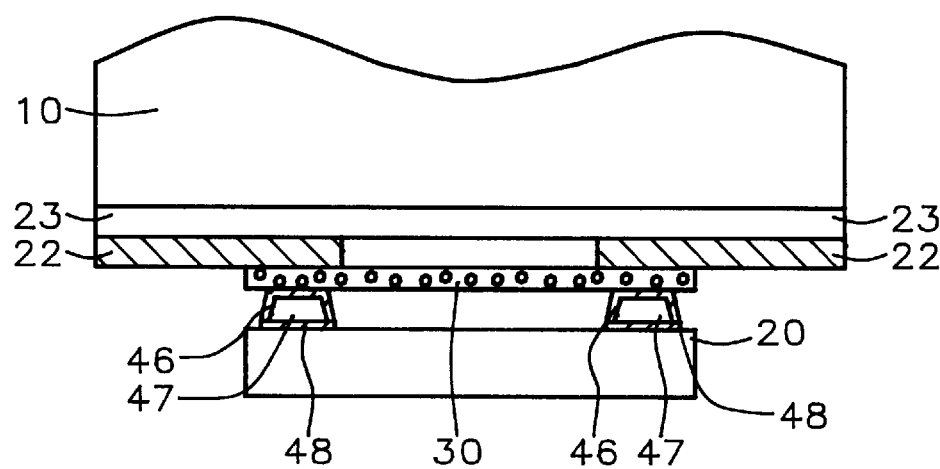
FIG. 4D shows a cross section view of a bonding set up for tape automated bonding using an integrated circuit element with composite bumps, a lead array without a window, and applying heat to the lead array.

Next, as shown in FIG. 4D, the lead array anisotropic conductive film assembly of FIG. 4C is placed on the integrated circuit element and positioned so that one inner lead end overlays the conductive metal coating 46 of each composite bump 46, 47, and 48 forming a bonding pair. The composite bumps are described in the first embodiment. When the assembly is compressed during the bonding process a number of conductive particles 31 in the anisotropic conductive film will be between the inner lead end and the conductive metal coating 46 of the composite bump of each bonding pair and the conductive particles 31 will make electrical contact with the lead end and conductive metal coating 46 of the composite bump of each bonding pair.

As shown in FIG. 4D the a thermode 10 is then brought into contact with the first dielectric layer 23 of the lead array and the thermode heats the assembly using a thermode temperature setting of between about 200° C. and 220° C. at a pressure of between about 20 and 40 kilograms/cm$^2$ for between about 5 and 20 seconds thereby forming the completed bonded structure shown in FIG. 2B. The conductive metal coating 46 and the polymer body 47 of the composite bumps will be deformed as the bond is formed.

Figure 4E:
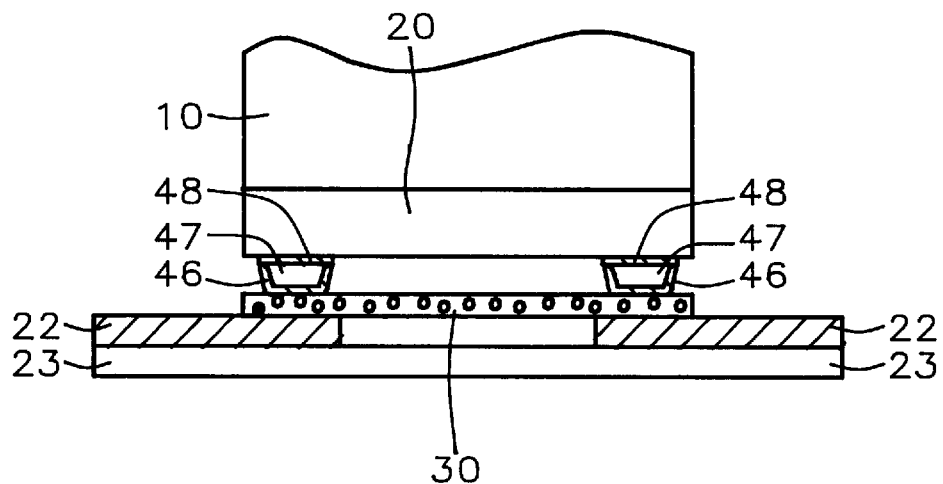
FIG. 4E shows a cross section view of a bonding set up for tape automated bonding using an integrated circuit element with composite bumps, a lead array without a window, and applying heat to the integrated circuit element.

An alternative bonding method is shown in FIG. 4E. Again the lead array—anisotropic conductive film assembly of FIG. 4C is placed on the integrated circuit element and positioned so that one inner lead end overlays the conductive metal coating 46 of each composite bump 46, 47, and 48 forming a bonding pair. When the assembly is compressed during the bonding process a number of conductive particles 31 in the anisotropic conductive film will be between the inner lead end and conductive metal coating 46 of the composite bump of each bonding pair and the conductive particles 31 will make electrical contact with the lead end and conductive metal coating of the composite bump of each bonding pair. In this method, as shown in FIG. 4E, a thermode 10 is then brought into contact with the back side of the integrated circuit element 20, the side opposite that on which the composite bumps 46, 47, and 48 are formed, and the thermode heats the assembly using a thermode temperature setting of between about 200° C. and 220° C. at a pressure of between about 20 and 40 kilograms/cm$^2$ for between about 5 and 20 seconds thereby forming the completed bonded structure shown in FIG. 2B. The conductive metal coating 46 and polymer body 47 of the composite bumps are deformed when the bond is formed.

An embodiment of the completed bonded structure formed by the method of the preceding embodiment is shown in FIG. 2B. The composite bumps 46, 47, and 48 are formed on the integrated circuit element 20. The inner lead ends of the copper leads 22 of the lead array are positioned so that one inner lead end overlays the conductive metal coating 46 of a composite bump forming a bonding pair. When the assembly is compressed during the bonding process described above a number of conductive particles 31 in the anisotropic conductive film are between the inner lead end and conductive metal coating 46 of the composite bump of each bonding pair and the conductive particles 31 make electrical contact with the lead end and conductive metal coating 46 of the composite bump of each bonding pair. The conductive metal coating 46 and the polymer body 47 of the composite bumps are deformed when the bond is formed. The insulating adhesive reflows during the time heat and pressure is delivered to the assembly by the thermode and encapsulates the bonded structure and holds the entire assembly together after curing. The insulating adhesive can be a material such as epoxy and can be thermoplastic, thermosetting, or a mixture of thermoplastic and thermosetting.

Figure 7:
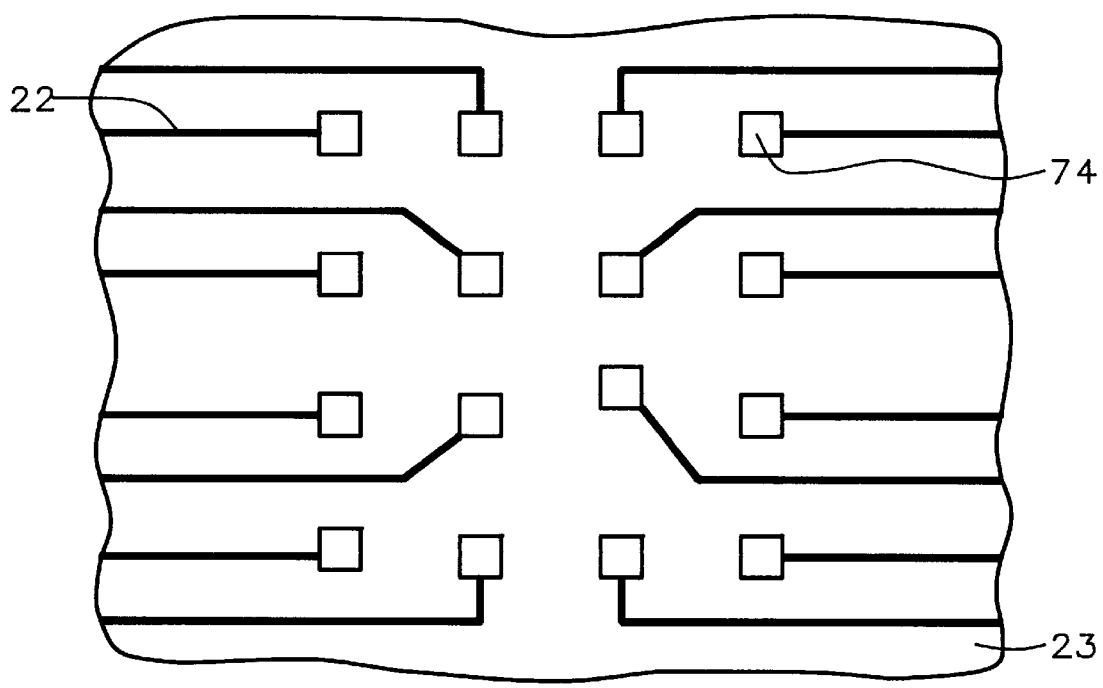
FIG. 7 shows a top view of a lead array without a window.

In the method and structure of this embodiment the lead array can have an area array of inner lead ends as shown in FIG. 7. The inner lead ends 74 of the leads 22 in the lead array are formed on a first dielectric layer 23 without a window. In this example the leads 22 and the inner lead ends 74 are copper.

While the invention has been particularly shown and described with reference to the preferred embodiments thereof, it will be understood by those skilled in the art that various changes in form and details may be made without departing from the spirit and scope of the invention.

What is claimed is:

1. A bonded structure, comprising:

an integrated circuit element having a number of composite bump bonding pads;

a first dielectric layer formed of first dielectric material wherein said first dielectric layer has an inner perimeter forming a window having no first dielectric material;

a lead array having a number of conductive leads formed on said first dielectric layer wherein each said conductive lead has an inner lead end and an outer lead end and each said inner lead end extends beyond said inner perimeter into said window;

an isolation film covering said window wherein said isolation film consists of a support metal layer formed on a layer of second dielectric material, said layer of second dielectric material contacts said inner lead ends, said second dielectric layer contacts said first dielectric layer, and said second dielectric layer insulates said support metal layer from said conductive leads;

a number of bonding pairs wherein each said bonding pair consists of one of said inner lead ends and one of said composite bump bonding pads; and an anisotropic conductive film having conductive particles dispersed in an insulating adhesive disposed so that a number of said conductive particles are between said inner lead end and said composite bump bonding pad of each said bonding pair wherein said conductive particles form electrical contact with said inner lead end and said composite bump bonding pad of each said bonding pair.

2. The bonded structure of claim 1 wherein each said inner lead end is formed on said first dielectric layer.

3. The bonded structure of claim 1 wherein said conductive leads are copper.

4. The bonded structure of claim 1 wherein said composite bump bonding pads have a first polymer body covered by a first conductive metal coating.

5. The bonded structure of claim 1 wherein said conductive particles are metal.

6. The bonded structure of claim 1 wherein said conductive particles have a second polymer body covered by a second conductive metal coating.

7. The bonded structure of claim 1 wherein said conductive particles have a third polymer body covered by a third conductive metal coating and said third conductive metal coating is covered by a coating of a fourth polymer body.

8. The bonded structure of claim 1 wherein said conductive particles are graphite.

9. The bonded structure of claim 1 wherein said support metal layer is aluminum having a thickness of between about 30 and 35 microns and said second dielectric layer is polyimide having a thickness between about 70 and 75 microns.

10. The bonded structure of claim 1 wherein said first dielectric layer is formed of polyimide having a thickness of between about 75 and 125 microns.

* * * * *